(12) United States Patent
Meir et al.

(10) Patent No.: US 11,894,351 B2
(45) Date of Patent: Feb. 6, 2024

(54) TUNABLE WHITE LIGHTING SYSTEMS

(71) Applicant: JUGANU LTD., Rosh Haain (IL)

(72) Inventors: Noam Meir, Herzliya (IL); Ariel Shochat, Brooklyn, NY (US)

( * ) Notice: Subject to any disclaimer, the term of this patent is extended or adjusted under 35 U.S.C. 154(b) by 0 days.

(21) Appl. No.: 17/680,531

(22) Filed: Feb. 25, 2022

(65) Prior Publication Data

US 2022/0223571 A1 Jul. 14, 2022

Related U.S. Application Data

(63) Continuation of application No. 16/483,584, filed as application No. PCT/US2018/020042 on Feb. 27, 2018, now Pat. No. 11,296,058.

(60) Provisional application No. 62/463,762, filed on Feb. 27, 2017.

(51) Int. Cl.
*H01L 25/075* (2006.01)
*H01L 33/50* (2010.01)
*H01L 33/56* (2010.01)
*H01L 33/62* (2010.01)

(52) U.S. Cl.
CPC ........ *H01L 25/0753* (2013.01); *H01L 33/502* (2013.01); *H01L 33/56* (2013.01); *H01L 33/62* (2013.01); *H01L 2933/0091* (2013.01)

(58) Field of Classification Search
None
See application file for complete search history.

(56) References Cited

U.S. PATENT DOCUMENTS

| 10,020,292 | B2 | 7/2018 | Stoll et al. |
| 10,208,943 | B2 | 2/2019 | Allen et al. |
| 11,296,058 | B2* | 4/2022 | Meir ............... H01L 33/62 |
| 2007/0223219 | A1 | 9/2007 | Medendorp, Jr. et al. |
| 2010/0219770 | A1 | 9/2010 | Kim et al. |
| 2010/0270567 | A1* | 10/2010 | Emerson ............ H05B 45/30 257/89 |
| 2011/0273079 | A1 | 11/2011 | Pickard et al. |
| 2012/0099303 | A1 | 4/2012 | Li et al. |
| 2012/0292651 | A1 | 11/2012 | You et al. |
| 2012/0319565 | A1 | 12/2012 | Sakuta et al. |
| 2013/0020956 | A1 | 1/2013 | Zhang et al. |
| 2013/0241392 | A1 | 9/2013 | Pickard et al. |
| 2013/0341590 | A1* | 12/2013 | Gupta ............... H01L 33/08 257/13 |
| 2020/0098732 | A1 | 3/2020 | Meir et al. |

OTHER PUBLICATIONS

International Search Report and Written Opinion issued in corresponding International Patent Application No. PCT/US18/20042 dated May 23, 2018, 9 pages.

* cited by examiner

*Primary Examiner* — Hung K Vu
(74) *Attorney, Agent, or Firm* — Intrinsic Law Corp.

(57) ABSTRACT

According to at least one aspect, a lighting device is provided. The lighting device comprises a circuit board; a light emitting diode (LED) array mounted to the circuit board and configured to emit broad spectrum light at any one of a plurality of different color correlated temperature (CCT) values within a range of CCT values, the LED array comprising a first LED configured to emit narrow spectrum light and a second LED that is different from the first LED and configured to emit broad spectrum light; and at least one elastomer encapsulating at least part of the circuit board and the LED array mounted to the circuit board.

20 Claims, 12 Drawing Sheets

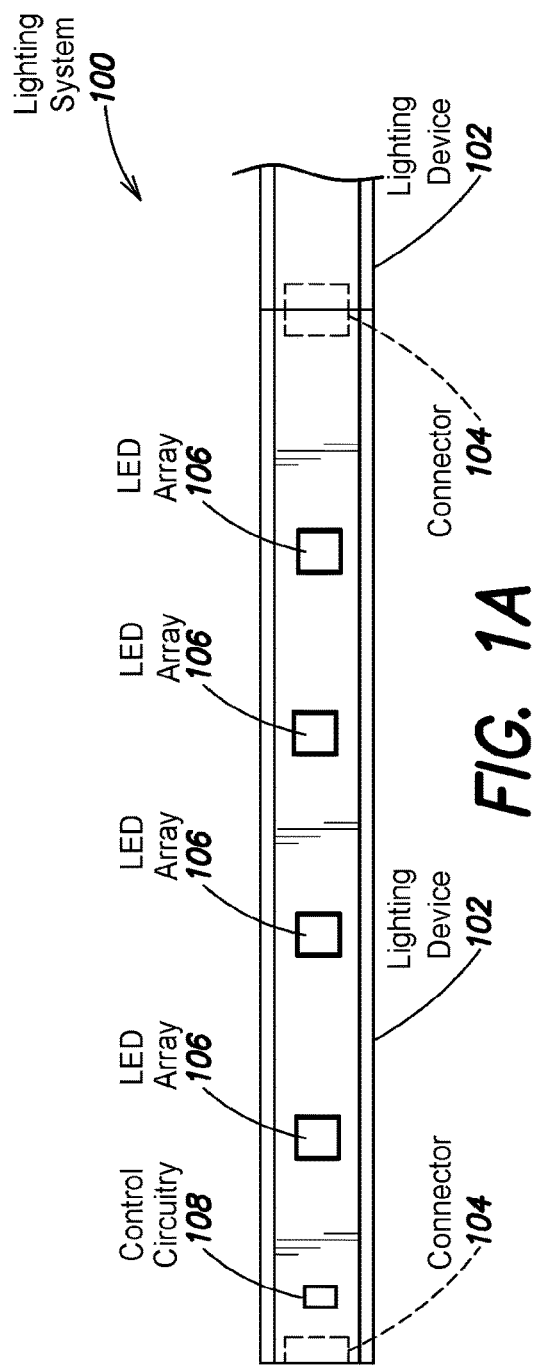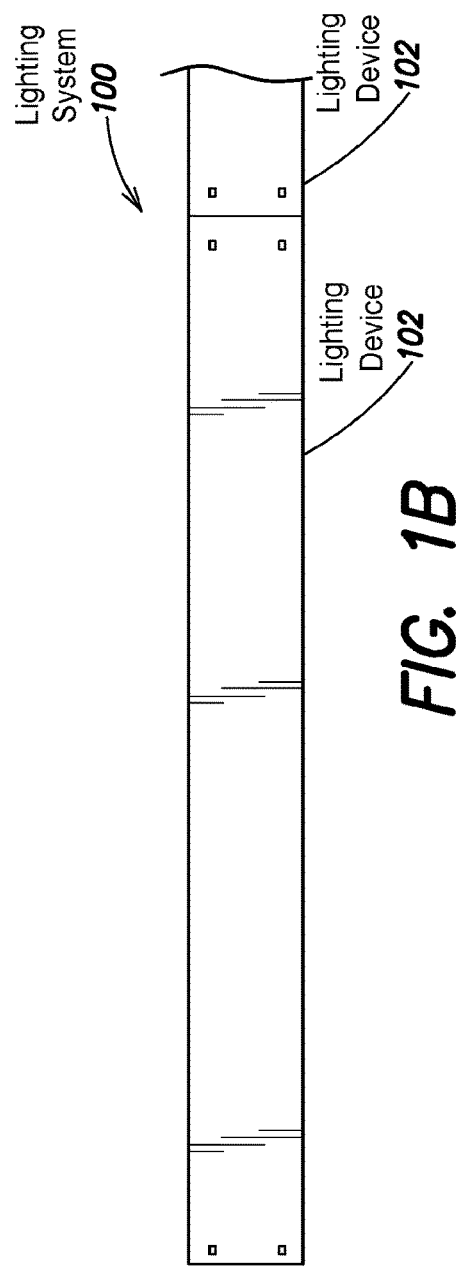

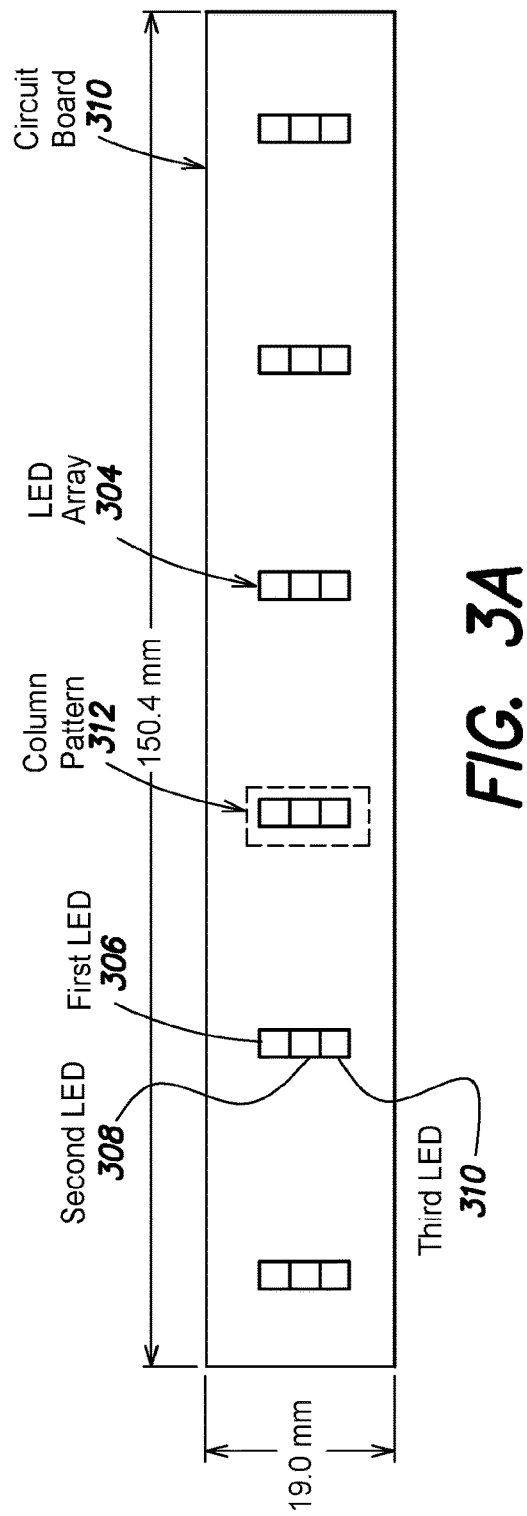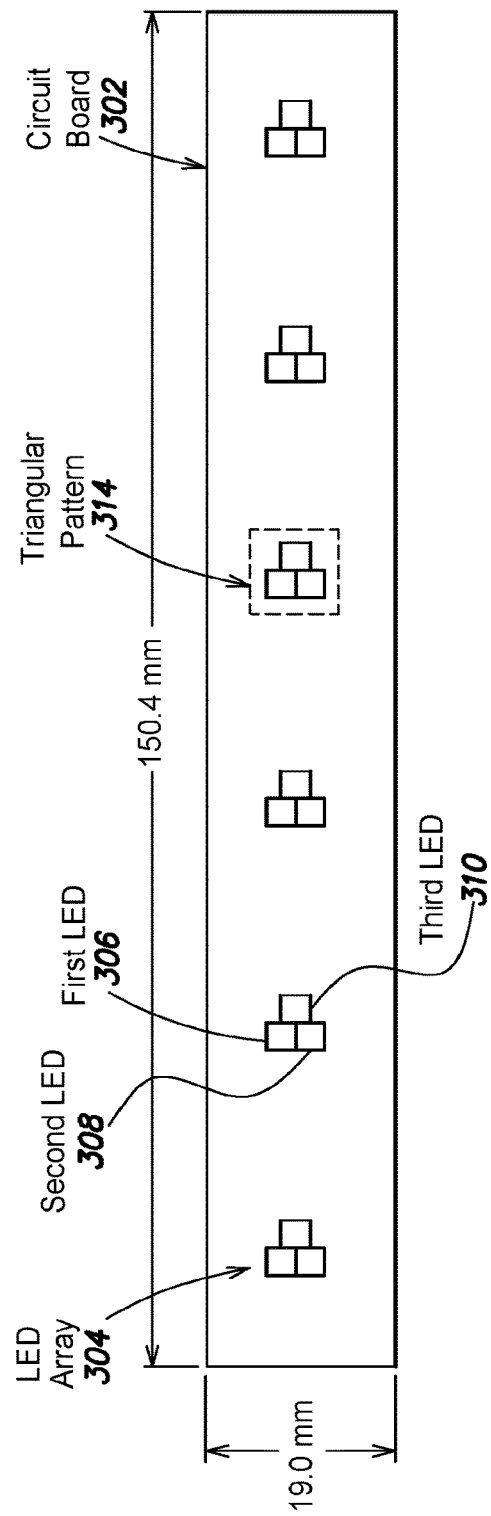

TUNABLE WHITE LIGHTING SYSTEMS

CROSS-REFERENCE TO RELATED APPLICATIONS

This application is a continuation of U.S. patent application Ser. No. 16/483,584, filed Aug. 5, 2019, which is the U.S. national stage application of International (PCT) Patent Application Serial No. PCT/US2018/020042, filed Feb. 27, 2018, which claims the benefit under 35 U.S.C. § 119(e) of U.S. Provisional Application Ser. No. 62/463,762, titled "TUNABLE WHITE FLEXIBLE LED LINEAR STRIP" filed on Feb. 27, 2017, each of which is hereby incorporated herein by reference in its entirety.

BACKGROUND

Light emitting diodes (LEDs) are typically formed from a semiconductor material that is doped to create a p-n junction. The LEDs typically emit light in a narrow spectrum (e.g., a spectrum that is smaller 200 nanometers in size) that is dependent upon the bandgap energy of the semiconductor material that forms the p-n junction. For example, an LED formed using one semiconductor material may emit light of a different color (and thereby in a different spectrum) than an LED formed using another semiconductor material.

White light has a broad spectrum (e.g., a spectrum that is larger than 200 nanometers in size), unlike the light typically emitted from a single LED. White light may be formed by mixing light with different colors (and thereby different spectrums) together. For example, white light may be formed by mixing red, green, and blue light or blue and yellow light. Inexpensive LEDs that create white light (a white LED) typically use an LED configured to emit blue light (a blue LED) that is coated with a yellow phosphor. The yellow phosphor coating converts a portion of the blue light from the LED into yellow light. The mixture of the blue and yellow light forms white light.

SUMMARY

According to at least one aspect, a lighting device is provided. The lighting device comprises: a circuit board; a light emitting diode (LED) array mounted to the circuit board and configured to emit broad spectrum light at any one of a plurality of different color correlated temperature (CCT) values (e.g., 2 values, 3 values, 4 values, 5 values, 6 values, 7 values, 8 values, 9 values, 10 values, etc.) within a range of CCT values (e.g., having a lower bound defined by a lowest CCT value in the plurality of different CCT values and an upper bound defined by a highest CCT value in the plurality of different CCT values), the LED array comprising a first LED configured to emit narrow spectrum light and a second LED that is different from the first LED and configured to emit broad spectrum light; and at least one elastomer encapsulating at least part of the circuit board and the LED array mounted to the circuit board.

In some embodiments, the range of CCT values has an upper limit of at least approximately 5000 degrees Kelvin (K) and a lower limit of no more than approximately 3000 degrees K.

In some embodiments, the upper limit is at least approximately 6500 degrees K and the lower limit is no more than approximately 2700 degrees K.

In some embodiments, the at least one elastomer is in direct contact with a top surface of the second LED and comprises at least one material that is configured to change at least one characteristic of the light emitted by the second LED.

In some embodiments, the at least one material is configured to change a CCT value of the light emitted by the second LED.

In some embodiments, the at least one material is configured to decrease the CCT value of the light emitted by the second LED.

In some embodiments, the at least one material comprises a material selected from the group consisting of: a pigment, a photo-luminescent material, and scattering particles.

In some embodiments, the broad spectrum light has a spectrum that is at least 200 nanometers in size.

In some embodiments, the narrow spectrum light that has a spectrum of no more than 200 nanometers in size.

In some embodiments, the first LED is a red LED configured to emit at least some light having a wavelength between approximately 600 nanometers (nm) and 670 nm.

In some embodiments, the second LED is a white phosphor-converted LED configured to emit white light.

In some embodiments, the LED array comprises a third LED that is different from the first and second LEDs and is configured to emit broad spectrum light.

In some embodiments, each of the second and third LEDs is a white phosphor-converted LED configured to emit white light.

In some embodiments, the first LED is configured to emit light having a wavelength between approximately 600 nanometers (nm) and 670 nm, the second LED is configured to emit light with a CCT value between approximately 4000 degrees Kelvin (K) and approximately 6700 degrees K, and the third LED is configured to emit light with a CCT value between 1800 degrees K and 4000 degrees K.

In some embodiments, the first LED is configured to emit light having a wavelength between approximately 600 nanometers (nm) and 670 nm, the second LED is configured to emit light with a CCT value of approximately 3500 degrees Kelvin (K), and the third LED is configured to emit light with a CCT value of approximately 2500 degrees K.

In some embodiments, the first LED is configured to emit light having a wavelength between approximately 600 nanometers (nm) and 670 nm, the second LED is configured to emit light with a CCT value of approximately 5000 degrees Kelvin (K), and the third LED is configured to emit light with a CCT value of approximately 2200 degrees K.

In some embodiments, the at least one elastomer is in direct contact with a top surface of each of the second and third LEDs and comprises at least one material configured to change the CCT value of the light from each of the second and third LEDs.

In some embodiments, each of the LEDs in the LED array are arranged in a column pattern.

In some embodiments, the LED array comprises only three LEDs and wherein the LEDs in the LED array are arranged in a triangular pattern.

In some embodiments, the LED array is configured to emit light with a positive correlation between light intensity and CCT value for at least a portion of the range of CCT values.

In some embodiments, the LED array is configured to emit light with the positive correlation between light intensity and CCT value between a CCT value of no more than approximately 3000 degrees Kelvin (K) and a CCT value of at least 4000 degrees (K).

In some embodiments, the lighting device is constructed to operate in both indoor installations and outdoor installations.

In some embodiments, the lighting device is no more than 5/8 inches tall.

In some embodiments, the lighting device is no more than 3 inches wide and/or is no more than 6 inches long.

BRIEF DESCRIPTION OF THE DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 1A shows a top view of an example lighting system, according to some embodiments of the technology described herein;

FIG. 1B shows a bottom view of the example lighting system of FIG. 1A, according to some embodiments of the technology described herein;

FIG. 3A shows a top view of an example circuit board for a lighting device, according to some embodiments of the technology described herein;

FIG. 3B shows a top view of another example circuit board for a lighting device, according to some embodiments of the technology described herein;

DETAILED DESCRIPTION

Figure 2:
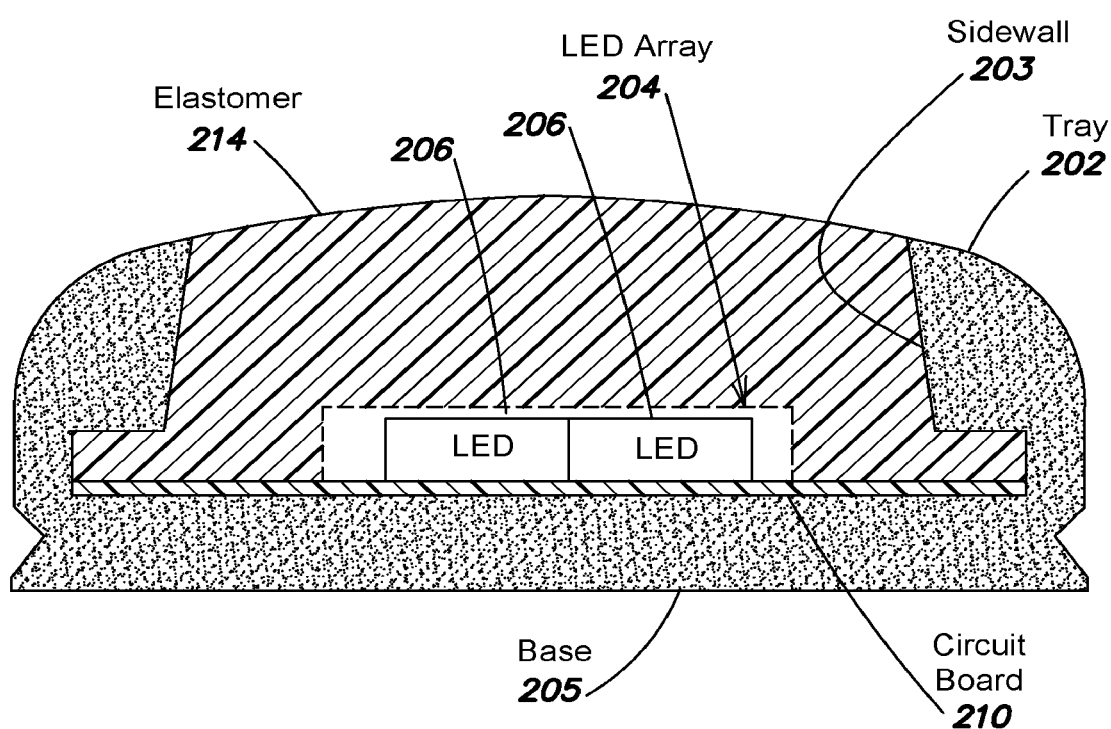
FIG. 2 shows a cross-sectional view of an example lighting device, according to some embodiments of the technology described herein.

As discussed above, inexpensive white LEDs generally are constructed as white phosphor-converted LEDs where a blue LED is covered with a phosphor coating that converts a portion of the blue light from the LED to yellow light so as to create white light. Conventional lighting devices are typically constructed with a set of such white LEDs (all with the same construction) that are connected to a common power source.

The inventors have that white phosphor-converted LEDs are generally only able to emit light with a single, fixed set of characteristics (e.g., color correlated temperature (CCT) value and/or a color). Thus, conventional LED strip lighting devices that generally employ a set of identically constructed white phosphor-converted LEDs are only capable of emitting light with a single, fixed set of characteristics (e.g., color correlated temperature (CCT) value and/or a color). While such conventional LED strip lighting devices may be suitable for hobbyist use, commercial establishments may have different demands. Commercial establishments may want the CCT of the light to change throughout the day to match the circadian rhythm of individuals exposed to the light (e.g., employees, customers, etc.). For example, the CCT of the light may need to be lower in the late evenings to facilitate a healthy sleep cycle and higher in the afternoon to combat afternoon fatigue.

Accordingly, aspects of the present disclosure relate to a lighting device that is capable of emitting white light with tunable characteristics. For example, the CCT of the light emitted by the lighting device may be configurable between a set of values within a range of values. The lighting device may employ, for example, an LED array with multiple LEDs that can be individually controlled to generate light at different CCT values within a range. The LEDs in the LED array may be separate and distinct (e.g., in different dies and/or packages mounted to a circuit board) or combined into a smaller number of devices, such as a single device (e.g., combined into a single die and/or a single package). The LED array may, for example, comprise at least one first LED that is configured to emit light with a color coordinate on a first side of the Black Body Curve (BBC) (e.g., when plotted in a CIE color space). The LED array may further comprise at least one second LED that is configured to emit light with a color coordinate on a second, opposite side of the BBC. Thus, the light from the at least one first LED may be combined with the light from the at least one second LED to generate light with a color coordinate anywhere along a portion of the BBC that corresponds to a particular range of CCT values.

In some embodiments, the lighting system may be implemented as an LED strip system comprising a plurality of interconnected LED strips each with a length of no more than approximately 6 inches, a width of no more than approximately 3 inches, and a height of no more than approximately 5/8 inches. In these embodiments, the LED strips may comprise a circuit board onto which a LED array may be mounted. The LED array may be configured to emit broad spectrum light at any one of a plurality of different color correlated temperature (CCT) values within a range of CCT values. The LED array may comprise a first LED configured to emit narrow spectrum light (e.g., the light has a spectrum of no more than 200 nanometers (nm) in size). The narrow spectrum light may have a color coordinate that is a first side of the BCC. The LED array may further comprise a second LED that is different from the first LED and configured to emit broad spectrum light (e.g., light with a spectrum of at least 200 nanometers in size). The broad spectrum light may have a color coordinate that is a second, opposite side of the BBC relative to the color coordinate of the narrow spectrum light. Thus, light from the first and second LEDs may be combined to form mixed light that is on the BBC. The components of the LED strip may be at least partially encapsulated with an elastomer, such as silicone, to protect the components from the environment.

It should be appreciated that the embodiments described herein may be implemented in any of numerous ways. Examples of specific implementations are provided below for illustrative purposes only. It should be appreciated that these embodiments and the features/capabilities provided may be used individually, all together, or in any combination of two or more, as aspects of the technology described herein are not limited in this respect.

Example Lighting System Designs

FIGS. 1A and 1B show top and bottom views, respectively, of an example lighting system 100. As shown, the lighting system 100 is constructed as a strip lighting system that comprises a plurality of electrically coupled lighting devices 102. Thereby, the length of the lighting system 100 may be customized by adding (or removing) lighting devices 102. Each of the lighting devices 102 may comprise LED arrays 106 mounted to a circuit board that is at least partially encapsulated in at least one elastomer (e.g., silicone). Each of the LED arrays 106 may comprise a plurality of LEDs each configured to emit light with different characteristics (e.g., light with different colors and/or different CCT values). The LED arrays 106 may be electrically coupled via the circuit board to connectors 104 mounted on each end of the circuit board. In turn, the connectors 104 may electrically couple each LED array 106 to an external device such as another lighting device 102 or a power adapter. Thus, the LED arrays 106 may receive power from the external device via the connector 104 and emit light.

In some embodiments, the LED arrays 106 may be electrically coupled to control circuitry 108 in the lighting device 102. The control circuitry 108 may be configured to control operation of the LED array 106 (e.g., by regulating the current and/or voltage applied to the LED arrays 106). Thus, the control circuitry 108 may regulate various characteristics of the light emitted by the LED arrays 106 such as a brightness of the light. The control circuitry 108 may adjust the brightness of individual LEDs within the LED array 106 using pulse width modulation (PWM). For example, the control circuitry 108 may rapidly turn individual LEDs on and off at such a high frequency that is imperceptible to humans. In this example, the brightness of the individual LEDs may be changed by adjusting a ratio of on-time to off-time within a particular cycle (sometimes referred to as a "duty cycle"). The higher the ratio of on-time to off-time, the brighter the LED. Conversely, lowering the ratio of on-time to off-time dims the LED. Thus, the duty cycle may be positively correlated with the average flux of the LED being controlled. The control circuitry 108 may vary the ratio of on-time to off-time based on control signals received from an external device (e.g., a dimming device, a power supply, or a combination thereof) via the connector 104. For example, the control circuitry 108 may include a look-up table that maps particular CCT values to a set of ratios for each individual Led within the LED arrays 106. In this example, the control circuitry 108 may receive information indicative of a desired CCT value, find the corresponding entry in the look-up table, and apply the set of ratios from the entry in the look-up table.

It should be appreciated that any operations attributed to the control circuitry 108 may be performed in circuitry that is external to the lighting device 108. For example, circuitry in an external device (e.g., a dimming device, a power supply, or a combination thereof) coupled to the lighting device 102 (e.g., via the connector 104) may perform various operations to control the LED arrays 106. Thus, the control circuitry 108 may, in some embodiments, be omitted from the lighting device 102 altogether.

The lighting devices 102 in the lighting system 100 may have particular dimensions to enable a wide range of applications. For example, the lighting devices 102 may have a depth of no more than approximately 1 inch, a length of no more than approximately 6 inches, and a width of no more than approximately 3 inches. It should be appreciated that the lighting devices 102 may be constructed with other dimensions.

The LED arrays 106 may comprise a plurality of LEDs that are each configured to emit light with different characteristics (e.g., emit light with different spectrums, different CCTs, and/or different colors). The LED arrays 106 may comprise any number of LEDs (e.g., 2 LEDs, 3 LEDs, 4 LEDs, 5 LEDs, etc.). The LEDs within the LED arrays 106 may be placed proximate each other so as to facilitate mixing of the light from each of the LEDs. The LEDs within the LED arrays 106 may be separated by a first distance that is smaller than a second distance that separates the LED arrays 106 on the lighting device 102. For example, the LED arrays 106 may be separated from each other by a distance of at least 25 millimeters (mm) while the LEDs within at least some of the LED arrays 106 may be separated by a distance of no more than 10 mm.

One or more components of the lighting device 102 may be mounted to a circuit board (e.g., a printed circuit board). For example, the LED arrays 106, the control circuitry 108, and/or the connectors 104 may be mounted to the circuit board. The circuit board may comprise one or more conductors to electrically couple the components mounted to the circuit board. The circuit board may be flexible to enable the lighting device 102 to bend to conform to uneven surfaces.

The circuit board may be at least partially encapsulated in at least one elastomer, such as a silicone and/or a rubber. The elastomer may insulate the circuit board and/or components mounted to the circuit board, such as the LED array 106, the control circuitry 108, and/or the connector 104, from the external environment. Thereby, the lighting system 100 may be employed in both indoor and outdoor applications.

FIG. 2 shows cross-section of an example implementation of the lighting device 102 shown in FIG. 1. As shown, the lighting device comprises a tray 202 with a channel that is configured to receive a circuit board 210 with an LED array 204 (e.g., LED array 106 described above) comprising LEDs 206 mounted thereon. An elastomer 214 may be potted over the circuit board 210 to at least partially encapsulate the circuit board 210 and secure the circuit hoard 210 to the lighting device.

The tray 202 may comprise a base 205 onto which the circuit board 210 may be disposed and sidewalls 203 that extend upward from the base 205. The sidewalls 203 may be parallel to each other and/or perpendicular to the base 205. The base 205 may form a bottom surface of the lighting device while the sidewalls 203 may form the lateral surfaces of the lighting device. The tray 202 may be constructed from any of a variety of materials. For example, the tray 202 may be constructed from an elastomer such as silicone. In this example, the elastomer may be manufactured through an extrusion process (e.g., a silicone extrusion process). The elastomer employed to construct the tray 202 may be different from the elastomer 214. For example, the elastomer in the tray 202 may have a different refractive index than the elastomer 214.

The circuit board 210 may be configured to electrically couple the LED array 204 to one or more other components. For example, the circuit board may comprise conductors that electrically couple the LED array 204 to a connector mounted to the circuit board (e.g., connector 104 in FIG. 1) and/or control circuitry mounted on the circuit board (e.g., control circuitry 108 in FIG. 1). The circuit board 210 may be, for example, an FR4 printed circuit board (PCB). Additionally (or alternatively), the circuit board may be a flexible circuit board 210 to permit the lighting device to bend without breaking.

The LED array 204 may comprise a plurality of LEDs, shown as LEDs 206, that are each configured to emit light in a different spectrum. The LED array 204 may be configured to emit broad spectrum light, such as light with a spectrum that is at least 200 nm in size (e.g., 200 nm, 225 nm, 250 nm, 275 nm, 300 nm, etc.), at any one of a plurality of different CCT values within a range of CCT values. The broad spectrum light may be, for example, white light. The LED array 204 may emit light with different CCT values within the range by changing the intensity of the light from the LEDs 206 individually. For example, the intensity of a first LED in the LED array 204 may be reduced relative to the intensity of a second LED in the LED array 204.

The elastomer 214 may be potted over the circuit board 210 to hold the circuit board 210 in-place in the lighting device. The elastomer 214 may, in some embodiments, be in direct contact with the LED array 204 (and/or LEDs 206). Allowing the elastomer 214 to be in direct contact with a top surface of the LEDs 206 may change the characteristics of the light emitted by certain LEDs 206 in the LED array 204 (e.g., broad spectrum LEDs such as white phosphor-converted LEDs) because the elastomer 214 may have a refractive index that is higher than air (e.g., a refractive index of approximately 1.5). For example, the blue component of the light from these white phosphor-converted LEDs between approximately 425 nm and 475 nm may be substantially increased when the light is emitted directly into the elastomer 214. Such change in the characteristics of the light may be counteracted using, for example, additives to the elastomer 214. For example, a pigment (e.g., a yellow pigment) may be added to the elastomer to counteract this effect. Additionally (or alternatively), photo-luminescent materials may be integrated into the elastomer 214, such as quantum dot materials, that are configured to absorb the additional blue light and emit light with longer wavelengths, such as yellow and/or red light.

The lighting device shown in FIG. 2 may be manufactured in any of a variety of ways. The lighting device may be manufactured by, for example, performing the following steps: (1) mounting the electronic components (e.g., the LED array 204 and/or any connectors) to the circuit board 210; (2) inserting the circuit board 210 into the tray 202; (3) potting the elastomer 214 over the circuit board 210 in the tray 202; and (4) packaging the lighting device.

It should be appreciated that the lighting device shown in FIG. 2 is only one example construction and that the lighting device may be constructed in various ways. For example, the lighting device may be implemented in any suitable way that comprises: a light guide that performs planar illumination; an LED array with at least two different LEDs (e.g., a blue LED, a red LED, and a yellow LED) embedded within the light guide in order to perform light in-coupling into the waveguide and color mixing in a short optical path. Additionally (or alternatively), the lighting device may comprise a Phosphor foil that may, for example, take the place of the phosphor deposited on white phosphor-converted LEDs. Thus, a narrow spectrum blue LED could be used in place of a phosphor-converted white LED.

FIG. 3A shows an example circuit board 302 for the lighting devices described herein (e.g., lighting device 102 shown in FIG. 1). As shown, a plurality of LED arrays 304 are mounted to the circuit board 302. The circuit board 302 has a length of 150.4 mm and a width of 19 mm. The LED arrays 304 each comprise three LEDs, shown as a first LED 306, a second LED 308, and a third LED 310, that each are configured to emit light with different characteristics. The LEDs 306, 308, 310 within the given LED array 304 may be placed proximate each other. In some embodiments, each of the LEDs 306, 308, 310 within a given LED array 304 may comprise at least one lateral surface that is no more than 10 mm away from the lateral surface of at least one LED in the same LED array 304. For example, each of the LEDs 306, 308, 310 within a given LED array 304 may comprise at least one lateral surface that is in direct contact with at least one other LED in the same LED array 304.

It should be appreciated that the LEDs 306, 308, 310 within a given LED array 304 may be arranged in any of a variety of ways. For example, the LEDs 306, 308, 310 in the LED arrays 304 may be arranged in a column pattern 312 along a width of the circuit board 302 as shown in FIG. 3A. Alternatively, the LEDs 306, 308, 310 in the LED arrays 304 may be arranged in a triangular pattern 314 as shown in FIG. 3B.

Example LED Array Configurations

As discussed above, the LEDs in the LED arrays mounted to the circuit board may be individually controlled to generate light with a CCT value that is variable within a range. The particular range in which the CCT value can be varied may depend on the particular configuration of the LED array, such as the particular combination of LEDs in the LED array. Described in detail below is a range of potential configurations each capable of emitting light with a CCT value that is variable within a range.

Figure 4:
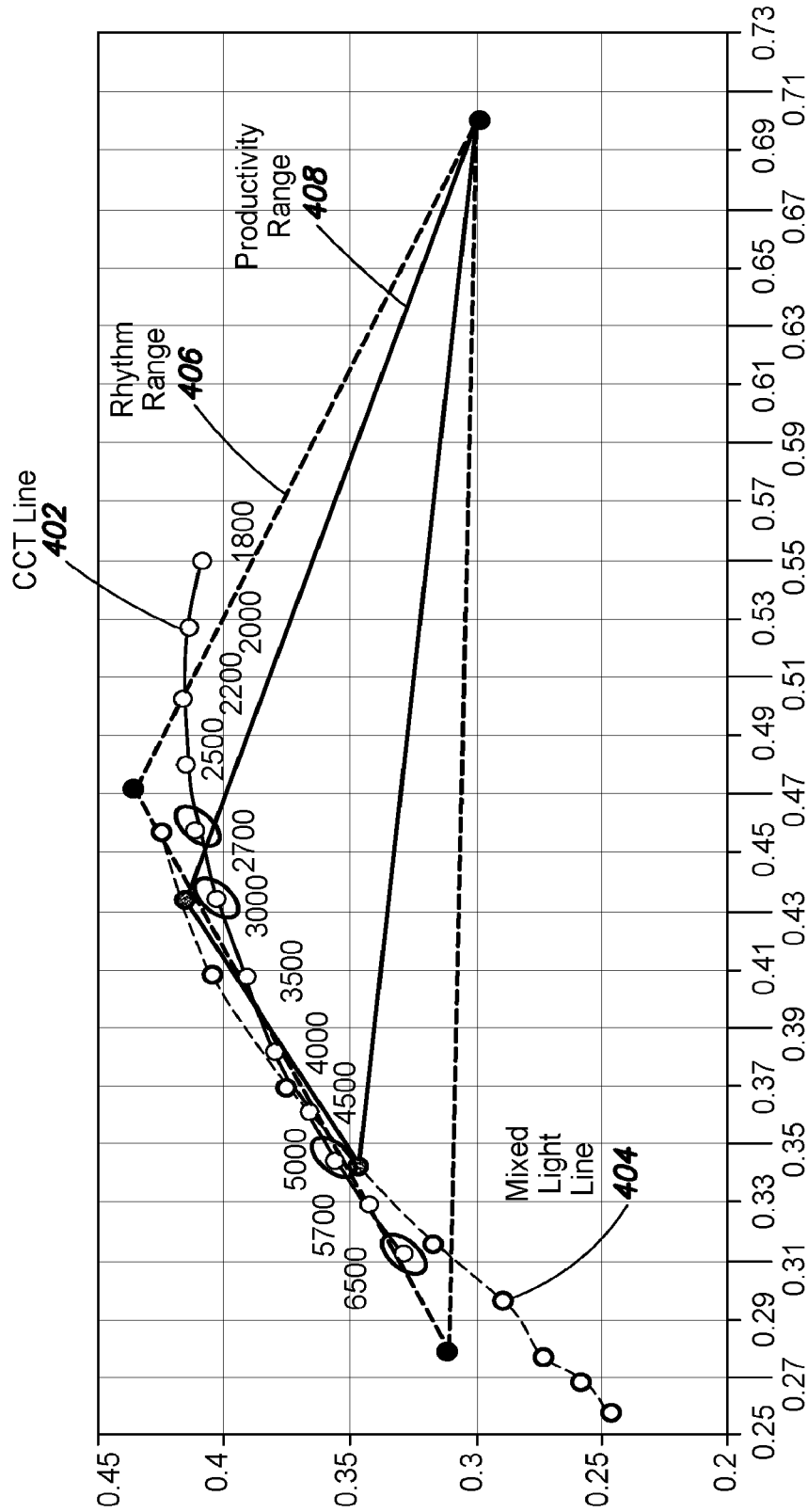
FIG. 4 is a graph showing the output of an example lighting device, according to some embodiments of the technology described herein.

In some embodiments, the LED array may comprise a total of three LEDs including two LEDs configured to emit broad spectrum light and one LED configured to emit narrow spectrum light. For example, the narrow spectrum LED may be configured to emit light with a wavelength between 600 and 670 nm (e.g., red light), the first broad spectrum LED may be a phosphor converted LED configured to emit white light with a CCT value between 4000 degrees K and 6700 degrees K (e.g., cool white light), and the second broad spectrum LED may be a phosphor converted LED configured to emit white light with a CCT value between 1800 degrees K and 4000 degrees K (e.g., warm light). The color coordinate of the light output of the broad spectrum LEDs (while embedded inside an elastomer in the lighting device) may be within a threshold (e.g., 3 step Macadam's ellipse) from the BBC and on an opposite side of the BBC relative to a color coordinate of the narrow spectrum LED. Such an arrangement may enable the mixed light of the three LEDs to have a color coordinate on the BBC within relatively a small deviation (e.g., within a 3 step Macadam's ellipse) as shown in FIG. 4. In FIG. 4, mixed light line 404 shows the color coordinates of light produced by such an arrangement of LEDs when the intensity of the LEDs within the arrangement are independently varied. The CCT line 402 shows the CCT values: 6500 degrees K, 5700 degrees K, 5000 degreed K, 4500 degrees K, 4000 degrees K, 3500 degrees K, 3000 degrees K, 2700 degrees K, 2500 degrees K, 2200 degrees K, 2000 degrees K, and 1800 degrees K plotted onto the CIE color space. The rhythm range 406 shows the range of color coordinates associated with light that may be employed to match the circadian rhythms of an individual plotted in the CIE color space. Productivity range 408 shows the range of color coordinates associated with light that may have a positive impact on productivity plotted in the CIE color space. As shown, the mixed light can accurately produce light within a range of color temperatures between 6500 degrees K and 2700 degrees K.

In some embodiments, the LED array may be configured to be tunable between the CCT values of 3000 degrees K and 5000 degrees K. In these embodiments, the LED array may comprise a narrow spectrum LED may be configured to emit light with a wavelength between 600 and 670 nm (e.g., red light), a first broad spectrum LED configured to emit broad spectrum light (e.g., white light such as warm white light) with a color temperature of 2500 degrees K, and a second broad spectrum LED configured to emit broad spectrum light (e.g., white light such as cool white light) with a color temperature of 3500 degrees K. The light output of the broad spectrum LEDs when embedded inside an elastomer (e.g., clear silicone) may be shifted while the light output of the narrow spectrum LED may not be shifted. For example, the light output of the first broad spectrum LED may be shifted from 2500 degrees K to be near 3000 degrees K on the opposite side of the BBC as the red LED and the second broad spectrum LED may be shifted from 3500 degrees K to be near 5000 degrees K on the same side of the BBC as the red LED but within the threshold of 3 step Macadam's ellipse. Additives (e.g., pigments, etc.) may be included in the elastomer to counteract any portion of this color shift.

In some embodiments, the LED array is configured to be tunable between the CCT values of 2700 degrees K and 6500 degrees K. In these embodiments, the LED array may comprise a narrow spectrum LED may be configured to emit light with a wavelength between 600 and 670 nm (e.g., red light), a first broad spectrum LED configured to emit broad spectrum light (e.g., white light such as warm white light) with a color temperature of 2200 degrees K, and a second broad spectrum LED configured to emit broad spectrum light (e.g., white light such as cool white light) with a color temperature of 5000 degrees K. The light output of the broad spectrum LEDs when embedded inside clear silicone may be shifted while the light output of the narrow spectrum LED may not be shifted. For example, the light output of the first broad spectrum LED may be shifted from 2200 degrees K to be near 2700 degrees K on the opposite side of the BBC as the red LED and the second broad spectrum LED may be shifted from 5000 degrees K to be near the 6700 degrees K on the same side of the BBC as the red LED. Additives (e.g., pigments, etc.) may be included in the elastomer to counteract any portion of this color shift.

In some embodiments, the LED array may comprise one or more phosphor converted that generate white light that is not on the Planckian curve. The Planckian curve may indicate the true white color coordinates for continuous values of the CCT. In these embodiments, the LED array may take advantage of additional colored LEDs that may be employed to bring the mixed light color coordinate to align with the Planckian curve. The intensity of the phosphor converted LED may be controlled to change the intensity of the mixed light while the intensity of the colored LED may be controlled to shift a color coordinate of the mixed light onto (or near) the Planckian curve. The addition of the colored LED may improve the color rendering index (CRI) value of the resulting mixed light. For example, the mixed light may have a CRI value of at least 85.

Figure 5:
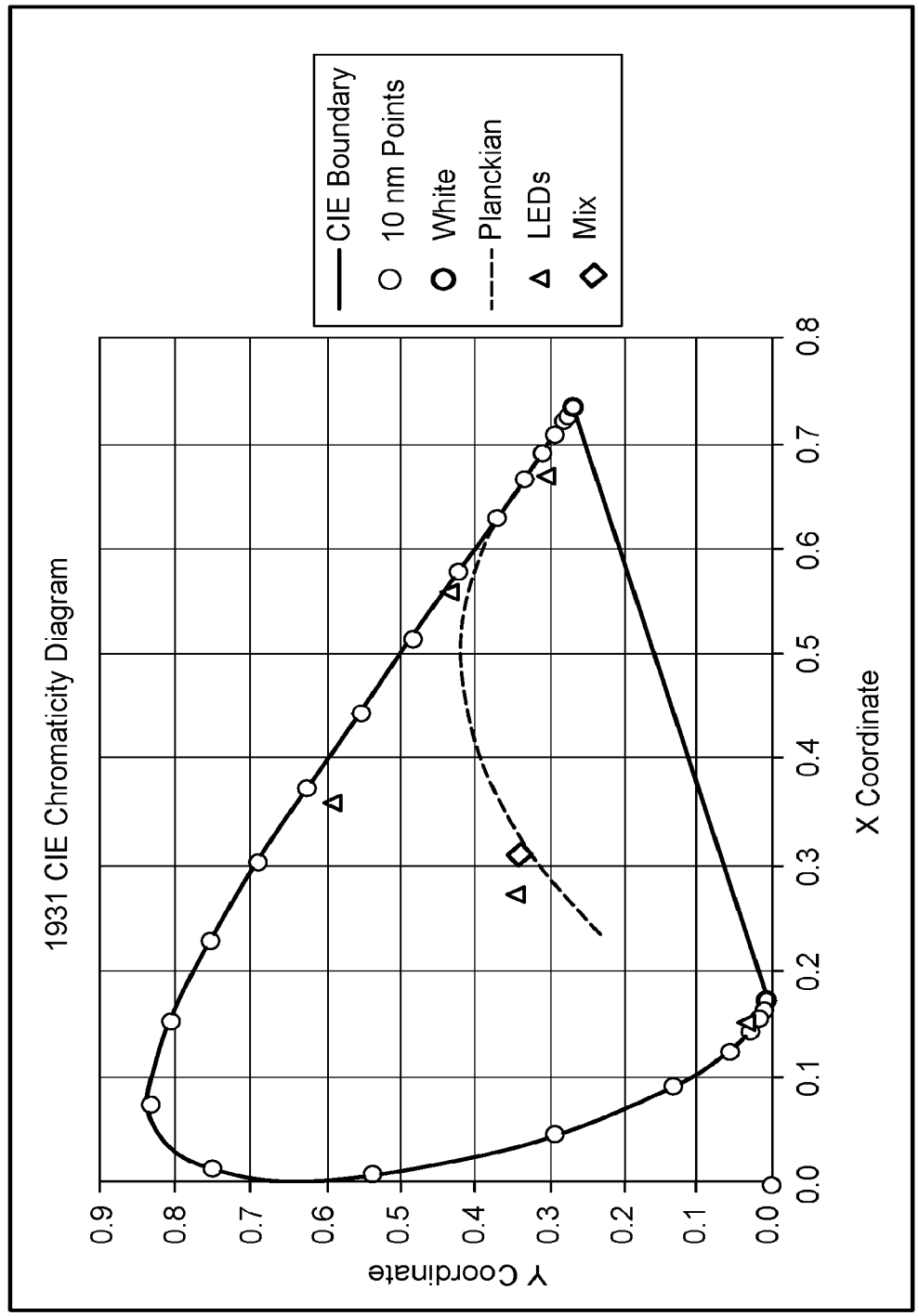
FIG. 5 is a graph showing the output of an example lighting device providing light at approximately 6500 degrees Kelvin (K), according to some embodiments of the technology described herein.

FIG. 5 is a graph showing mixed light at a CCT value of approximately 6500 degrees K generated by an example LED array in a lighting device. The example LED array comprises five LEDs each configured to emit light with different color coordinates (shown as triangles in FIG. 5) that are individually controlled. Table 1 shows the flux output of each of the five LEDs and their respective color coordinate. The characteristics of the resulting mixed light are shown in Table 2.

TABLE 1

Example Configuration to a CCT Value of 6500 Degrees K

| LED Number | Flux Y [lumens] | Color Coordinates | |
|---|---|---|---|
| | | X Coordinate | Y Coordinate |
| 1 | 0 | 0.1546 | 0.0302 |
| 2 | 0 | 0.3600 | 0.5900 |
| 3 | 180 | 0.6695 | 0.2998 |
| 4 | 0 | 0.5600 | 0.4300 |
| 5 | 2000 | 0.2750 | 0.3400 |

TABLE 2

Example Results from Configuration in Table 1

| Flux Y [candela] | Color Coordinates | | CCT Value [Degrees Kelvin] | Distance to Planck |
|---|---|---|---|---|
| | X Coordinate | Y Coordinate | | |
| 2180 | 0.3115 | 0.3363 | 6511 | 0.00746 |

Figure 6:
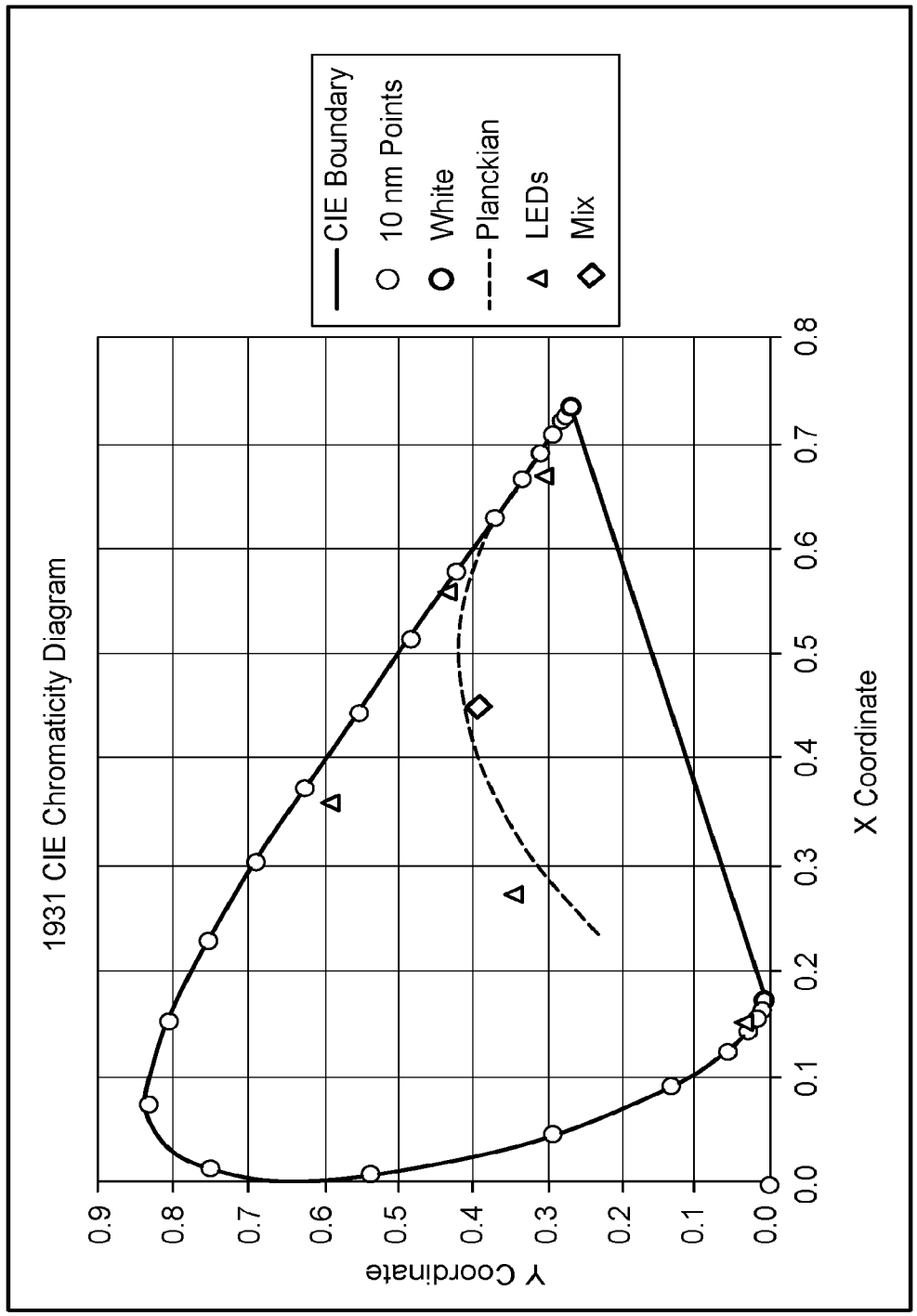
FIG. 6 is a graph showing the output of an example lighting device providing light at approximately 2700 degrees Kelvin (K), according to some embodiments of the technology described herein.

As shown in Tables 1 and 2 in addition to FIG. 5, the lighting device may be configured to emit light that is proximate the Planckian curve at a CCT value of approximately 6500 degreed K using only two of the five LEDs in the LED array. The CCT value of the mixed light may be changed by, for example, changing the intensity of light emitted by one or more of the LEDs in the array as shown in FIG. 6. FIG. 6 is a graph showing mixed light at a CCT value of approximately 2700 degrees K (instead of approximately 6500 degrees K shown in FIG. 5). The CCT value is reduced by adding more yellow light (e.g., by turning off LED 3 and turning on LED 4). Table 3 shows the flux output of each of the five LEDs and their respective color coordinate. The characteristics of the resulting mixed light are shown in Table 4.

TABLE 3

Example Configuration to a CCT Value of 2700 Degrees K

| LED Number | Flux Y [lumens] | Color Coordinates | |
|---|---|---|---|
| | | X Coordinate | Y Coordinate |
| 1 | 0 | 0.1546 | 0.0302 |
| 2 | 0 | 0.3600 | 0.5900 |
| 3 | 0 | 0.6695 | 0.2998 |
| 4 | 4000 | 0.5600 | 0.4300 |
| 5 | 2000 | 0.2750 | 0.3400 |

TABLE 4

Example Results from Configuration in Table 3

| Flux Y | Color Coordinates | | CCT | Distance |
|---|---|---|---|---|
| [candela] | X Coordinate | Y Coordinate | Value | to Planck |
| 6000 | 0.4496 | 0.3951 | 2725 | 0.00497 |

It should be appreciated that the particular design of the LED arrays shown in Tables 1 and 3 is only one particular implementation. Additional (or fewer) LEDs may be employed. For example, the LED array may comprise a red LED, a yellow LED, and a white LED. Additionally, a green LED may be added to more closely meet the exact color coordinates of the Planckian curve. In another example, the LED array may comprise a red LED, a green LED, and a white LED.

In some embodiments, any of the colored light that is to be mixed with the white light may be from a separate light-guide plate (LGP). The LGP may be disposed over a planar remote phosphor plate and/or between a blue light guide and a phosphor foil (which converted the blue light to white light). Alternatively, the LGP may include quantum dot material that emits light in the required color (e.g., yellow or green) while the quantum dot is being excited by light with a lower wavelength (e.g., blue light and/or ultraviolet light) emitted by an LED integrated within the LGP. Thus, the intensity of the quantum dot yellow emission and/or the quantum dot green emission may be controlled.

Figure 7:
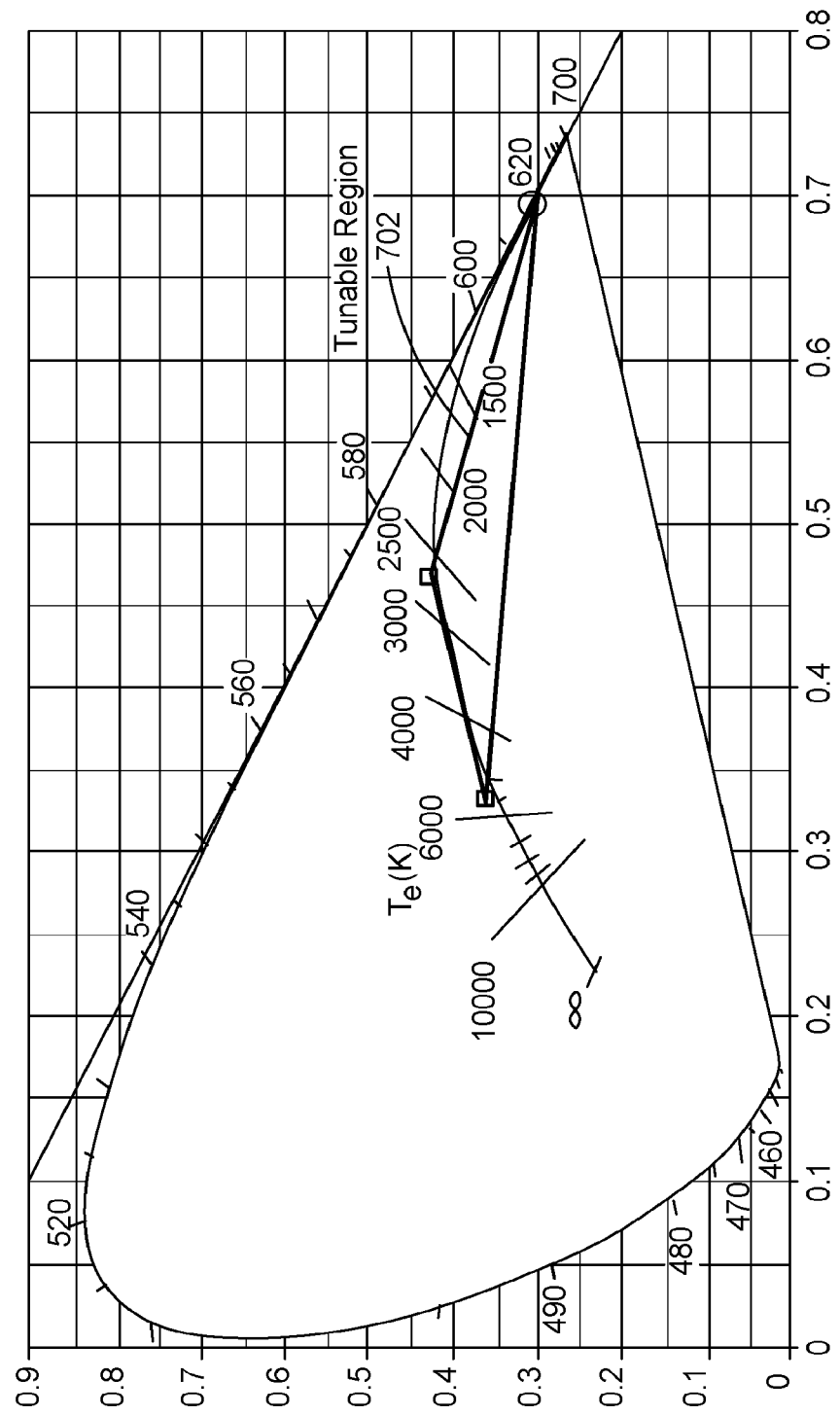
FIG. 7 is a graph showing the tunable range of an example lighting device, according to some embodiments of the technology described herein.

In some embodiments, the LED array may be constructed to emit mixed light with color coordinates that are on and/or near the BBC. In these embodiments, the LED array may comprise two white LEDs that are each configured to emit light with a color coordinate that is on a first side of the BBC (e.g., above the BBC) and a colored LED that is configured to emit light with a color coordinate on a second, opposite side of the BBC (e.g., below the BBC). Thus, the intensity of the LEDs within the LED array may be individually controlled to generated mixed light on the BBC. FIG. 7 is a graph showing an example tunable region 702 for such an LED array. The vertices of the triangular tunable region are formed by the color coordinates of each of the three LEDs in the LED array. As shown, the LED array comprises a first white LED configured to emit light with a CCT between 2500 degrees K and 3000 degrees K, a second white LED configured to emit light with a CCT between 5000 degrees K and 6000 degrees K, and a red LED. The tunable region 702 includes a large section of the BBC between approximately 2700 degrees K and 5700 degrees K.

Figure 8:
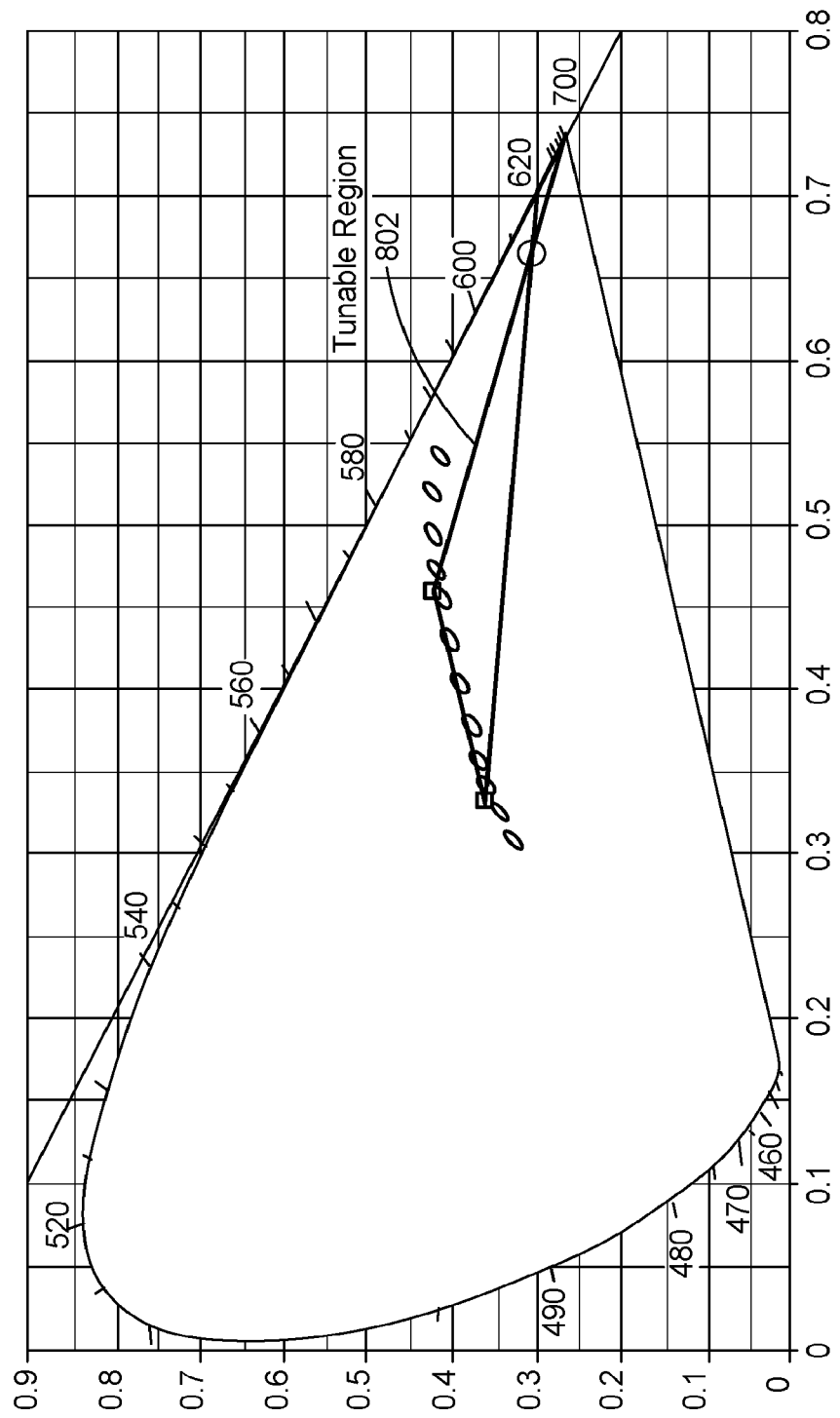
FIG. 8 is a graph showing the tunable range of another example lighting device, according to some embodiments of the technology described herein.

In some embodiments, the LED array may be constructed to emit mixed light with color coordinates that are within the 3 step Macadam's ellipse of different points along the BBC. The difference between color coordinates within a 3 step Macadam's ellipse may be unperceivable to the human eye. Thus, a viewer may still be unable to distinguish between light an LED array that emits light within the 3 step Macadam's ellipse of different points along the BBC and an LED array that emits light at points directly on the BBC. In these embodiments, the LED array may comprise two white LEDs that are each configured to emit light with a color coordinate that is on a first side of the BBC (e.g., above the BBC) and a colored LED that is configured to emit light with a color coordinate on a second, opposite side of the BBC (e.g., below the BBC). Thus, the intensity of the LEDs within the LED array may be individually controlled to generated mixed light within the 3 step Macadam's ellipse of different points along the BBC. FIG. 8 is a graph showing an example tunable region 802 for such an LED array. The vertices of the triangular tunable region are formed by the color coordinates of each of the three LEDs in the LED array. The tunable region 802 includes 3 step Macadam's ellipses for a number of different points along the BBC between approximately 2700 degrees K and 5700 degrees K.

Figure 9:
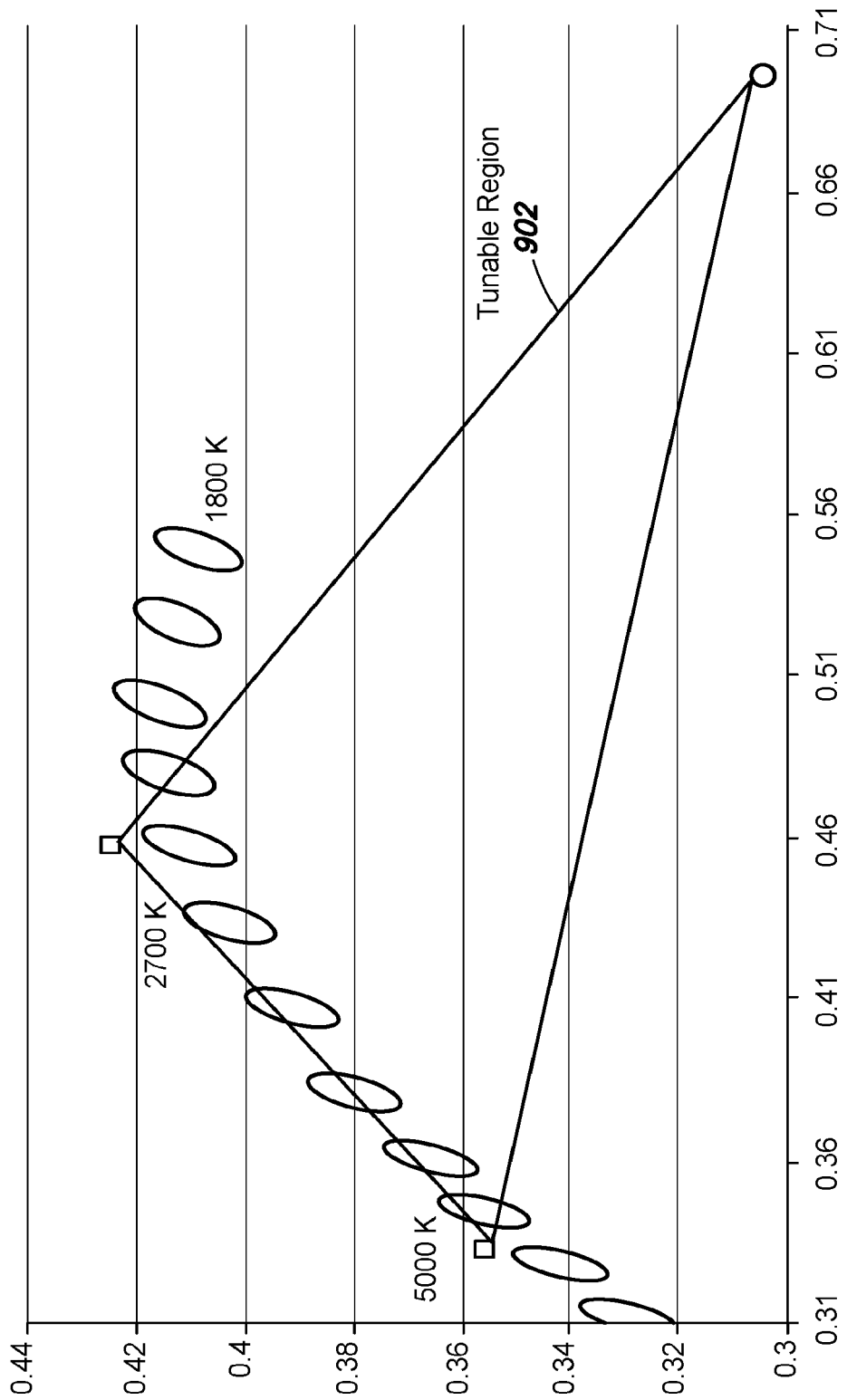
FIG. 9 is a graph showing the tunable range of another example lighting device, according to some embodiments of the technology described herein.
Figure 10:
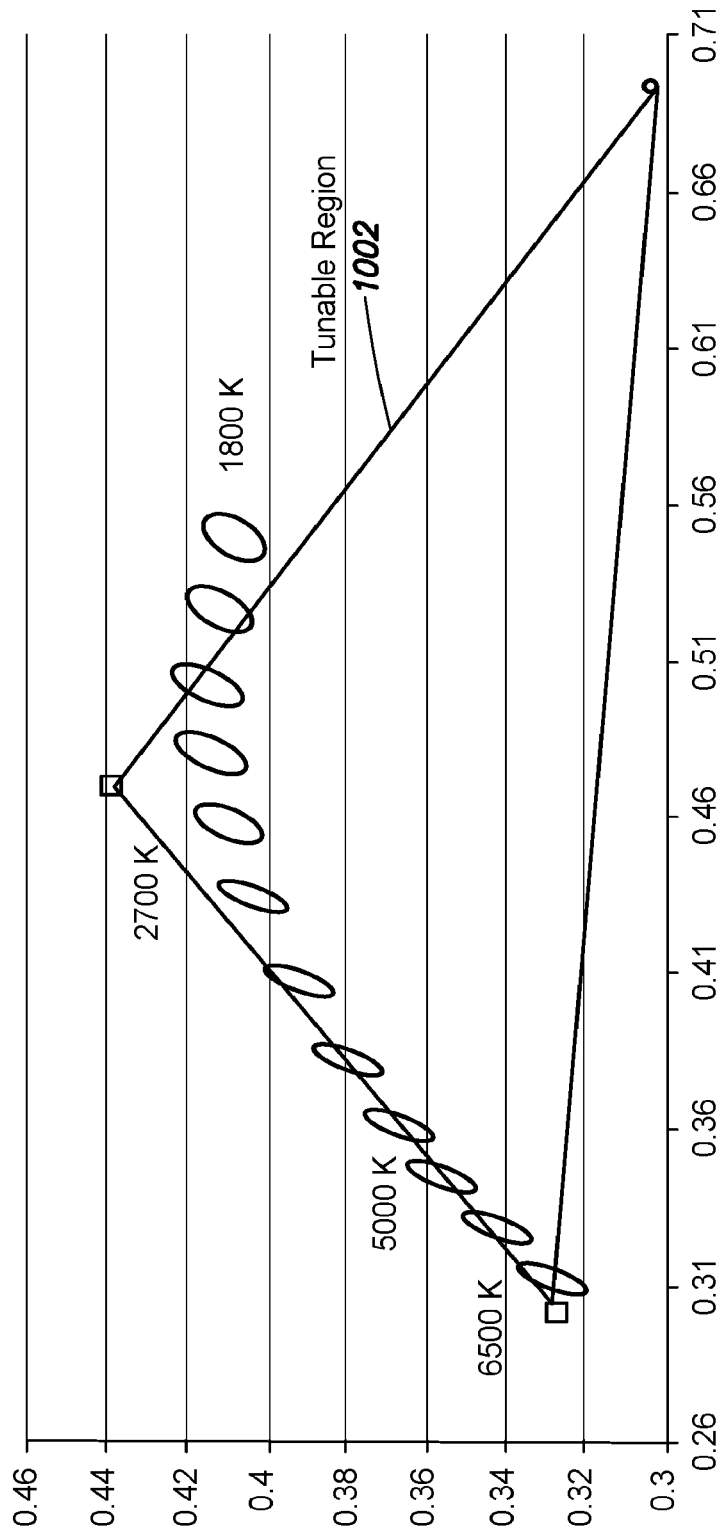
FIG. 10 is a graph showing the tunable range of another example lighting device, according to some embodiments of the technology described herein.

In some embodiments, the LED array may be configured to output light within a productivity range (e.g., productivity range 408) that may improve the productivity of workers. The productivity range may include, for example, a region between 3000 degrees K and 5000 degrees K. In these embodiments, the LED array may comprise a red LED paired with two white LEDs. The first white LED may emit light with a color coordinate near the 3-step Macadam's ellipse around the point on the BBC with a color temperature of 2700 degrees K and the second white LED may emit light with a color coordinate near the 3-step Macadam's ellipse around the point on the BBC with a color temperature of 5000 degrees K. FIG. 9 is a graph showing an example tunable region 902 for such a lighting device. The vertices of the triangular tunable region 902 are defined by the color coordinate of the light emitted by each of the LEDs. The circle in the bottom right corner shows the color coordinate of the red LED and the two boxes in the left side of the graph show the color coordinates of the two white LEDs. As shown, the tunable region 902 includes the productivity region between 3000 degrees K and 5000 degrees K. The size and/or shape of the tunable region may be changed by, for example, replacing one or both of the white LEDs with other white LEDs with different color coordinates. FIG. 10 is a graph showing an example tunable region 1002 for such a modified lighting device. As shown, the second white LED was replaced with another LED that emits light with a color coordinate near the 3-step Macadam's ellipse around the point on the BBC with a color temperature of 6500 degrees K. As a result, the size of the tunable region 1002 has increased and includes a larger portion of the BBC.

Figure 11:
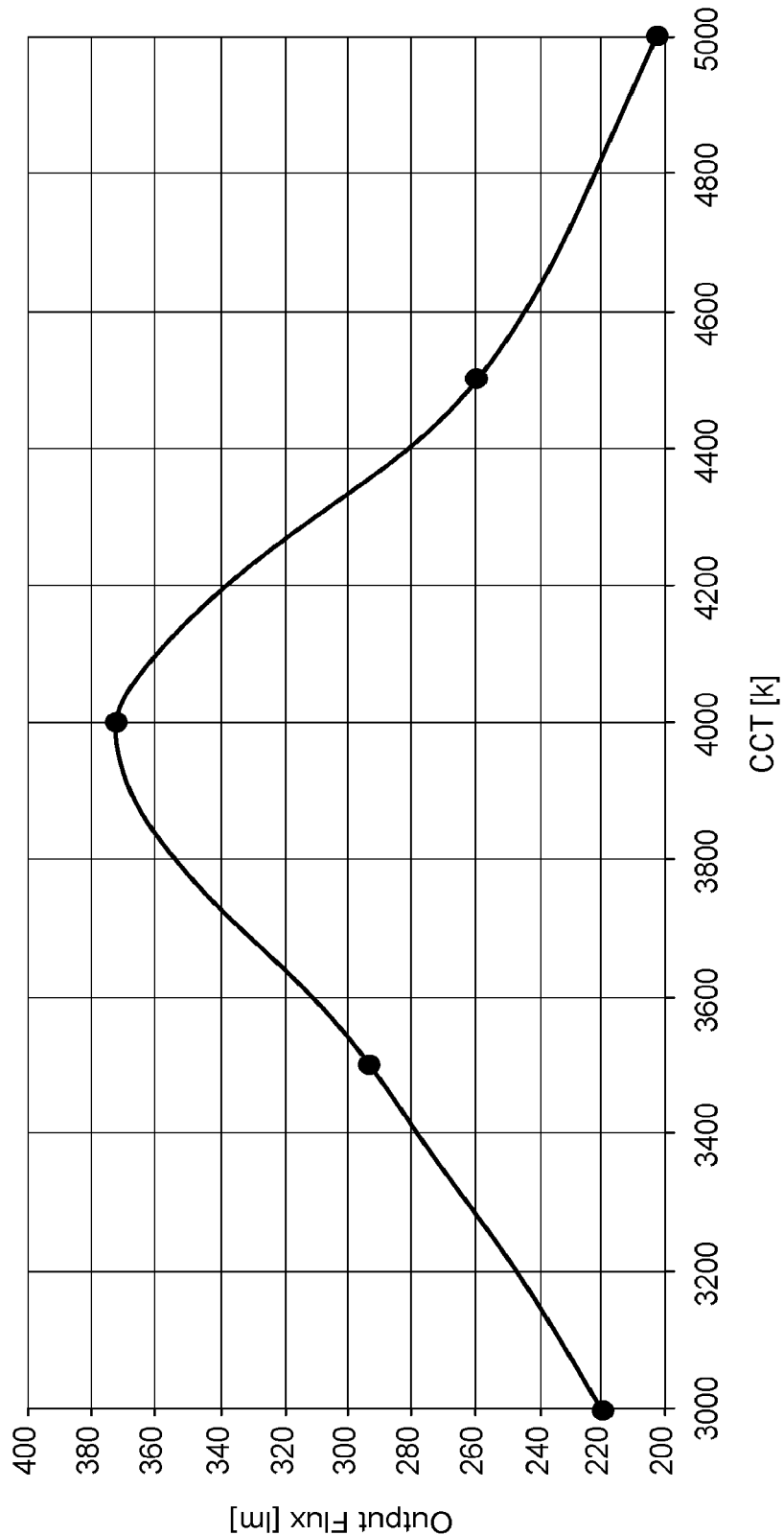
FIG. 11 is a graph showing the light intensity of an example lighting device providing light at different CCT values, according to some embodiments of the technology described herein.
Figure 12:
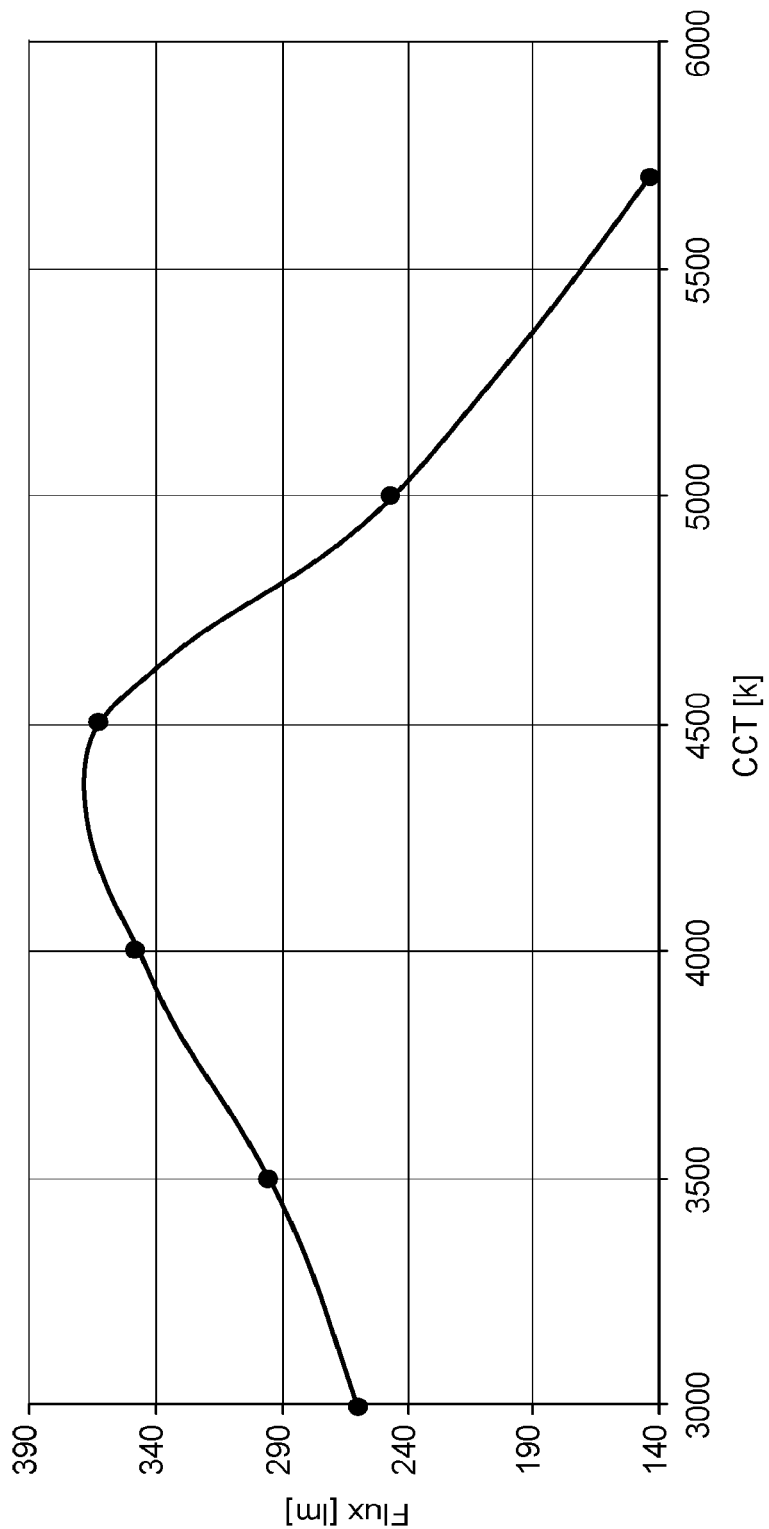
FIG. 12 is a graph showing the light intensity of another example lighting device providing light at different CCT values, according to some embodiments of the technology described herein.

It should be appreciated that the particular LEDs chosen for the LED array may impact the flux of the combined lights from the LED array at different CCT values. FIG. 11 shows the example flux of the mixed light produced by an LED array comprising a first LED with a CCT value of approximately 3000 degrees K and a second CCT value of approximately 5000 degrees K. As shown, the peak flux occurs at approximately 4000 degrees K, which is the average of the first LED with a CCT of 3000 degrees K and the second LED with a CCT of 4000 degrees K. The difference between the flux at 3000 degrees K CCT and the flux at 5000 degrees K may be caused by, for example, differences in construction of the two LEDs. The flux at CCT values below 3000 degrees K may be increased by replacing the LED with a CCT of 3000 degrees with an LED with a lower CCT. Conversely, the flux at CCT values above 3000 degrees K may be increased by replacing the LED with a CCT of 5000 degrees with an LED with a higher CCT. For example, the LED with a CCT of 5000 degrees may be replaced with an LED with a CCT of 5700 degrees K. FIG. 12 shows the mixed light produced by such a device. As shown, the peak flux occurs at approximately 4350 degrees K, which is the average of the first LED with a CCT of 3000 degrees K and the second LED with a CCT of 5700 degrees K. Relative to FIG. 11, the flux at 5000 CCT is increased from approximately 204 lumens to approximately 246 lumens. The difference between the flux at 3000 degrees K CCT and the flux at 5700 degrees K may be caused by, for example, differences in construction of the two LEDs.

Example Warm Dimming Effect

The warm dimming effect of an incandescent lamp is the red shift in the color of light from the incandescent lamp as the incandescent lamp is dimmed. This effect is fundamental to incandescent lamp due to the power consumption reduction while dimming (e.g., by reducing the voltage applied to the incandescent lamp). In contrast, white phosphor-converted LEDs general exhibit a blue shift when dimmed. Various techniques are described below to create a warm dimming effect that may be employed individually or in any combination:

1. The LED array may be constructed with two different white LEDs with different CCT values that may be individually controlled (e.g., using PWM techniques described above). Thus, the intensity of the white LED with the higher CCT may be dimmed first while the intensity of light from the other LED is held constant to cause a red shift.
2. In the warm dimming effect, the light output has positive correlation with the output CCT (e.g., the higher the flux, the higher the output CCT). Thus, the LED array may be configured to achieve maximal flux at a CCT value that is at least 3000 degrees K. Such an LED array may be designed using, for example, a first white LED with a CCT of 3500 degrees K and a second LED with a CCT value of 2500 degrees K (resulting in an average CCT value of 3000 degrees K when driven to 100% duty cycle).
3. The tunable region (e.g., the black body locus (BBL)) may be split into multiple sections to accommodate power supply constraints (e.g., the constraints of a class 2 (96 Watt) power supply). The first section may be between 3000-2500 degrees K CCT and the second section may be between 2500-1800 degrees K CCT. By dividing the tunable region, two LEDs (e.g., a first LED with a CCT of 3500 degrees K and a second LED with a CCT of 2500 degrees K) can be activated to obtain 3000 degree K CCT in full power. Once reducing from 2500 degree K CCT, the LEDs that emit light with a CCT value of 2500 degrees K or less (e.g., the second LED with a CCT of 2500 degrees K and a third LED with a CCT of 1800 degrees K) may be activated while the LED(s) with CCT values above 2500 degrees K (e.g., the first LED with a CCT of 3500 degrees K) may be turned off.
4. The light of at least one of the LEDs in the array may be shifted using pigments (e.g., red and/or yellow pigments). For example, a low CCT LED (e.g., an LED with a CCT of 1800 degrees K) in the LED array may be replaced with a less expensive higher CCT LED (e.g., an LED with a CCT of 2000 degrees K). In this example, red and/or yellow pigments may be added to an elastomer encapsulating the LED such that the light has a CCT value of 1800 CCT. Once the pigment formulation has been determined, the remaining LEDs may be selected so as to comply with any remaining constraints, such as having a maximum flux output at a color temperature of 3000 degrees K CCT.
5. The LED array may comprise at least three different LEDs. Given the parabolic shape of the BBC between 1800 degrees K and 3000 degrees K, an LED array with two light sources alone may be incapable of generating light with a CCT value that is configurable between 1800 degrees K and 3000 degrees K.

CONCLUSION

It should be appreciated that the lighting devices described herein may be designed to achieve any of a variety of desired light output characteristics. For example, the lighting devices described herein may be designed for a range of light intensity values; a range of power consumption levels; and a range of voltage levels such as 24 Volts. Further, the lighting devices may be configured to be dimmable via any of a variety of external dimmable electronic drivers.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately," "about," and "substantially" may be used to mean within ±20% of a target value in some embodiments, within ±10% of a target value in some embodiments, within ±5% of a target value in some embodiments, and yet within ±2% of a target value in some embodiments. The terms "approximately," "about," and "substantially" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be object of this disclosure. Accordingly, the foregoing description and drawings are by way of example only.

What is claimed is:

1. A lighting device, comprising:
    a circuit board;
    a light emitting diode (LED) array mounted to the circuit board and configured to emit broad spectrum light at any one of a plurality of different color correlated temperature (CCT) values within a range of CCT values, the LED array comprising a first LED configured to emit narrow spectrum light and a second LED that is different from the first LED and configured to emit broad spectrum light;
    control circuitry electrically coupled to the LED array and configured to vary an intensity of light output from the first LED and/or from the second LED to produce a mixed light having a target CCT value; and
    at least one elastomer encapsulating at least part of the circuit board and the LED array mounted to the circuit board, the at least one elastomer configured to convert the narrow spectrum light emitted by the first LED to broad spectrum light.

2. The lighting device of claim 1, wherein the range of CCT values has an upper limit of at least approximately 5000 degrees Kelvin (K) and a lower limit of no more than approximately 3000 degrees K.

3. The lighting device of claim 2, wherein the upper limit is at least approximately 6500 degrees K and the lower limit is no more than approximately 2700 degrees K.

4. The lighting device of claim 1, wherein the at least one elastomer is in direct contact with a top surface of the second LED and comprises at least one material that is configured to change at least one characteristic of the light emitted by the second LED.

5. The lighting device of claim 4, wherein the at least one material is configured to change a CCT value of the light emitted by the second LED.

6. The lighting device of claim 5, wherein the at least one material is configured to decrease the CCT value of the light emitted by the second LED.

7. The lighting device of claim 4, wherein the at least one material comprises a material selected from the group consisting of: a pigment, a photo-luminescent material, and scattering particles.

8. The lighting device of claim 1, wherein the broad spectrum light has a spectrum that is at least 200 nanometers in size.

9. The lighting device of claim 1, wherein the narrow spectrum light that has a spectrum of no more than 200 nanometers in size.

10. The lighting device of claim 1, wherein the first LED is a red LED configured to emit at least some light having a wavelength between approximately 600 nanometers (nm) and 670 nm.

11. The lighting device of claim 1, wherein the second LED is a white phosphor-converted LED configured to emit white light.

12. The lighting device of claim 1, wherein:
the LED array comprises a third LED that is different from the first and second LEDs and is configured to emit broad spectrum light, and
the control circuitry is configured to vary the intensity of light output from the first LED, from the second LED, and/or from the third LED to produce the mixed light having the target CCT value.

13. The lighting device of claim 12, wherein each of the second and third LEDs is a white phosphor-converted LED configured to emit white light.

14. The lighting device of claim 13, wherein the at least one elastomer is in direct contact with a top surface of each of the second and third LEDs and comprises at least one material configured to change the CCT value of the light from each of the second and third LEDs.

15. The lighting device of claim 12, wherein the first LED is configured to emit light having a wavelength between approximately 600 nanometers (nm) and 670 nm, the second LED is configured to emit light with a CCT value between approximately 4000 degrees Kelvin (K) and approximately 6700 degrees K, and the third LED is configured to emit light with a CCT value between 1800 degrees K and 4000 degrees K.

16. The lighting device of claim 12, wherein the first LED is configured to emit light having a wavelength between approximately 600 nanometers (nm) and 670 nm, the second LED is configured to emit light with a CCT value of approximately 3500 degrees Kelvin (K), and the third LED is configured to emit light with a CCT value of approximately 2500 degrees K.

17. The lighting device of claim 12, wherein the first LED is configured to emit light having a wavelength between approximately 600 nanometers (nm) and 670 nm, the second LED is configured to emit light with a CCT value of approximately 5000 degrees Kelvin (K), and the third LED is configured to emit light with a CCT value of approximately 2200 degrees K.

18. The lighting device of claim 1, wherein each of the LEDs in the LED array are arranged in a column pattern.

19. The lighting device of claim 1, wherein the LED array comprises only three LEDs and wherein the LEDs in the LED array are arranged in a triangular pattern.

20. The lighting device of claim 1, wherein the control circuitry is configured to vary a duty cycle of the first LED and/or of the second LED to set the intensity of the light output from the first LED and/or from the second LED, respectively.

* * * * *